United States Patent
Makita et al.

(10) Patent No.: US 6,943,388 B1
(45) Date of Patent: Sep. 13, 2005

(54) SHEET-TYPE β-FESI$_2$ ELEMENT, AND METHOD AND DEVICE FOR MANUFACTURING THE SAME

(75) Inventors: Yunosuke Makita, Tsukuba (JP); Yasuhiko Nakayama, Kawasaki (JP); Zhengxin Liu, Tsukuba (JP)

(73) Assignees: National Institute of Advanced Industrial Science and Technology, Tokyo (JP); System Engineers Co., Ltd., Kanagawa (JP)

( * ) Notice: Subject to any disclaimer, the term of this patent is extended or adjusted under 35 U.S.C. 154(b) by 0 days.

(21) Appl. No.: 10/803,870

(22) Filed: Mar. 18, 2004

(51) Int. Cl.$^7$ ............... H01L 31/0328; H01L 31/0336; H01L 31/072; H01L 31/109
(52) U.S. Cl. .................. 257/201; 257/184; 257/448; 257/643
(58) Field of Search ................ 257/201, 184, 257/448, 643

(56) References Cited

U.S. PATENT DOCUMENTS 6,288,415 B1 * 9/2001 Leong et al. ............... 257/94

2004/0203220 A1 * 10/2004 Morooka et al. ........... 438/581

FOREIGN PATENT DOCUMENTS

| JP | 2002-353526 | 12/2002 |
| JP | 2003-051462 | 2/2003 |
| JP | 2003-258321 | 9/2003 |

* cited by examiner

*Primary Examiner*—David Nelms
*Assistant Examiner*—Tu-Tu Ho
(74) *Attorney, Agent, or Firm*—Flynn, Thiel, Boutell & Tanis, P.C.

(57) ABSTRACT

In the air or in an inert gas atmosphere, powder raw materials are deposited on a flexible sheet for forming a film, an electrode, and a protective film under pressing a heating roller, and a device can be manufactured by continuous operations in which all the steps are integrated. There is provided a cheap device, by which the manhours for manufacturing a device is reduced, the throughput is improved in comparison with those of a previous device by which a film, an electrode, and a protective film have been manufactured on a crystal substrate in a vacuum.

8 Claims, 5 Drawing Sheets

(A)

(B)

US 6,943,388 B1

SHEET-TYPE β-FESI₂ ELEMENT, AND METHOD AND DEVICE FOR MANUFACTURING THE SAME

BACKGROUND OF THE INVENTION

1. Field of the Invention

The invention relates to a sheet-type β-FeSi$_2$ element, which is in connection with technical fields of semiconductor element devices such as an optical sensor, a solar cell and a thermoelectric conversion element in electronics fields and uses an new semiconductor material, and a method and an device for manufacturing the element in a simple way.

2. Description of the Prior Art

In a previous semiconductor device, a functional thin film is formed as a material on a silicon (Si) substrate, a GaP substrate, a GaAs substrate, and a ceramic flat base material, an electrode for input and output of electric signals is formed on the film, using a photolithography technology and vacuum processing, and a light-antireflection protective film is manufactured, using vacuum processing.

Recently, there has been proposed and developed use of a β-FeSi$_2$ semiconductor device comprising a material which is rich as one of earth resources and has less environmental load. Many of methods for forming a junction film by using the above material are executed by vacuum processing such as a laser ablation method, an ion implantation one, a molecular beam epitaxy one, and vacuum deposition one. On the other hand, there has been proposed a method in which not a previous metal film deposition method, but a method using an effect by conversion into a metallic crystal phase at a high temperature peculiar to a β-FeSi$_2$ material is used for forming the electrode, and problems caused by the photolithography technology for forming a metal electrode are solved by a laser annealing method (Japanese Patent Application No. 2001-157087, 2001-235664). Moreover, a previous technique using SiO$_2$ in a process for forming a film in a vacuum has been applied for forming a light-antireflection protective film.

There have been the following problems in each step of a previous method for manufacturing an element:

(1) Use of single crystal Si for a substrate of an element increases the price, and high material and manufacturing costs are caused by use of the single crystal Si for a case in which an element is required to be manufactured with an extremely low price, for example, for manufacturing a solar cell;

(2) When a polycrystalline silicon substrate is used, it is difficult to obtain the enough amount of a so-called low grade Si scrap, which is a raw material for a polycrystalline silicon substrate, with a high impurity concentration;

(3) When a semiconductor junction layer with good characteristics is formed, using Si and compounds, the throughput is low and the cost is high because an expensive device for advanced control of growth in a high vacuum is required to be used;

(4) When the photolithography technology for forming a metal film and the laser annealing method are used for forming an electrode, an expensive device is required to be used, and the high throughput cannot be obtained; and (5) When a vacuum process is used for forming a light-antireflection protective film, the device cost becomes high, and the throughput is limited by the internal volume of the device.

SUMMARY OF THE INVENTION

Prevention of an increase in the production cost causes the above-described problems. In the present invention, an element is formed without adopting a large scale device such as a vacuum system or a high energy laser, and without using expensive single-crystal raw materials in all steps for manufacturing the element. That is, there is adopted a technique in which a semiconductor film is formed by heating reaction, using a film on which powders are deposited, without using a single crystal substrate in order to form a n-p junction layer after forming a semiconductor thin film. When an electrode is formed, an electrode pattern is formed, using a phenomenon in which a part of β-FeSi$_2$ film is made into a metal film by exposing the part to a high-temperature environment. Manufacturing steps without adopting an expensive device used for forming a protective film are applied. The above-described problems have been solved by adopting an integrated system in which all manufacturing steps are continuously executed to improve the throughput of forming the whole element.

DESCRIPTION OF THE PREFERRED EMBODIMENTS

Embodiment According to First Aspect of the Present Invention

Figure 1:
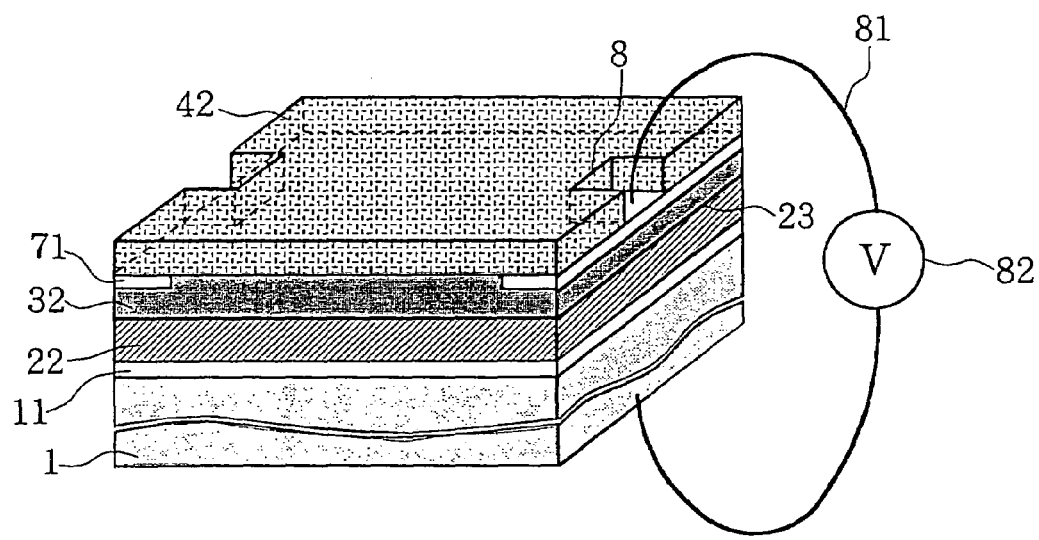
FIG. 1 is an exemplary configuration view of a device element using a β-FeSi$_2$ semiconductor on a flexible substrate according to the present invention.

FIG. 1 is an exemplary view of a device element using a β-FeSi$_2$ semiconductor on a flexible substrate according to the embodiment of a first aspect. The substrate 1 forming the element uses a flexible sheet material. An n-type semiconductor film 22 with n-type characteristics of the β-FeSi$_2$ semiconductor is laminated on the substrate 1. A thin film layer 11 to be a base electrode exists on the side of the substrate side of the semiconductor film. Furthermore, a p-type semiconductor film 32 with p-type characteristics of the β-FeSi$_2$ semiconductor is laminated on the n-type semiconductor film 22; the n-type and the p-type thin films in the lower layer form a junction section 23; and a junction thin film element comprising two kinds of β-FeSi$_2$ semiconductor thin films with the n-type and the p-type characteristics, respectively, is formed on a flexible sheet.

An electrode 71 is formed on the upper side of the p-type semiconductor film 32, and a part of the junction thin film element is made into a metal film of α-Fe$_2$Si$_5$ for use as an electrode.

In addition, a dielectric film 42 is laminated as a light-antireflection film on the p-type semiconductor film 32 to provide the film 42 on the surface of the junction thin film element as a surface protective layer for device functions. A transparent medium may be used for the dielectric film 42.

Apart of the dielectric film 42 is scraped off at a section 8 at which an electrode lead wire 81 through which a current and a voltage are taken out is bonded on to the exposed part of the electrode 71. The lead wire 81 is connected to a voltammeter 82. Though the type of the base semiconductor film and that of the film over the base one are n-type and p-type, respectively, a configuration with the reversed types (then-type is changed to the p-type and vice versa.) may be adopted. A case in which a polymer sheet using, for example, polyimide is adopted for the flexible sheet corresponds to an embodiment according to a third aspect.

Embodiment According to Second Aspect of the Present Invention

According to the embodiment of a second aspect, a metal thin plate like stainless steel is used as a flexible sheet shown in FIG. 1. In the present embodiment, a thin film layer 11 for a base electrode is not required, and a base substrate 1 forming an element is also used as a base electrode. A metal thin plate, in which iron, nickel, and copper are independently used, or alloys comprising them, or alloys comprising them as principal ingredients and one or more kinds of additional elements are included, is adopted as the flexible sheet.

Embodiment According to Third Aspect of the Present Invention

According to the embodiment of a third aspect, a polymer resin film using, for example, polyimide or fluoropolymers, is used as a flexible sheet shown in FIG. 1. In the present embodiment, a film on which Au or Al is deposited is used as a thin film layer 11 for a base electrode.

Embodiment According to Fourth Aspect of the Present Invention

Figure 2:
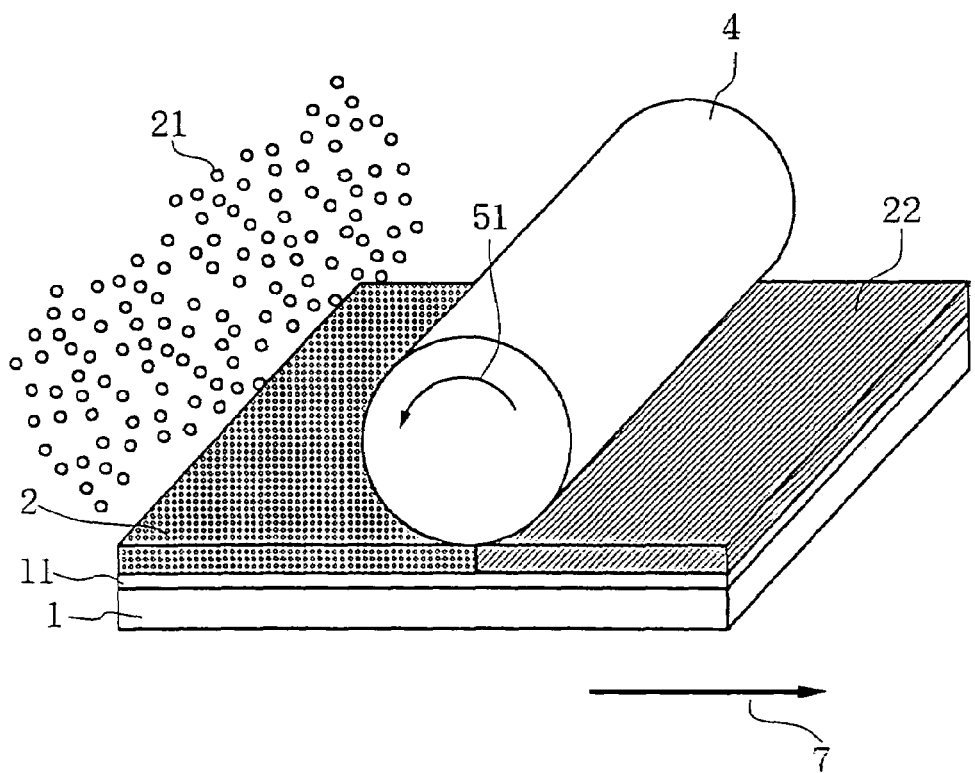
FIG. 2 is an exemplary view of a step for manufacturing a β-FeSi$_2$ thin film as a first layer on a flexible substrate according to the present invention.
Figure 3:
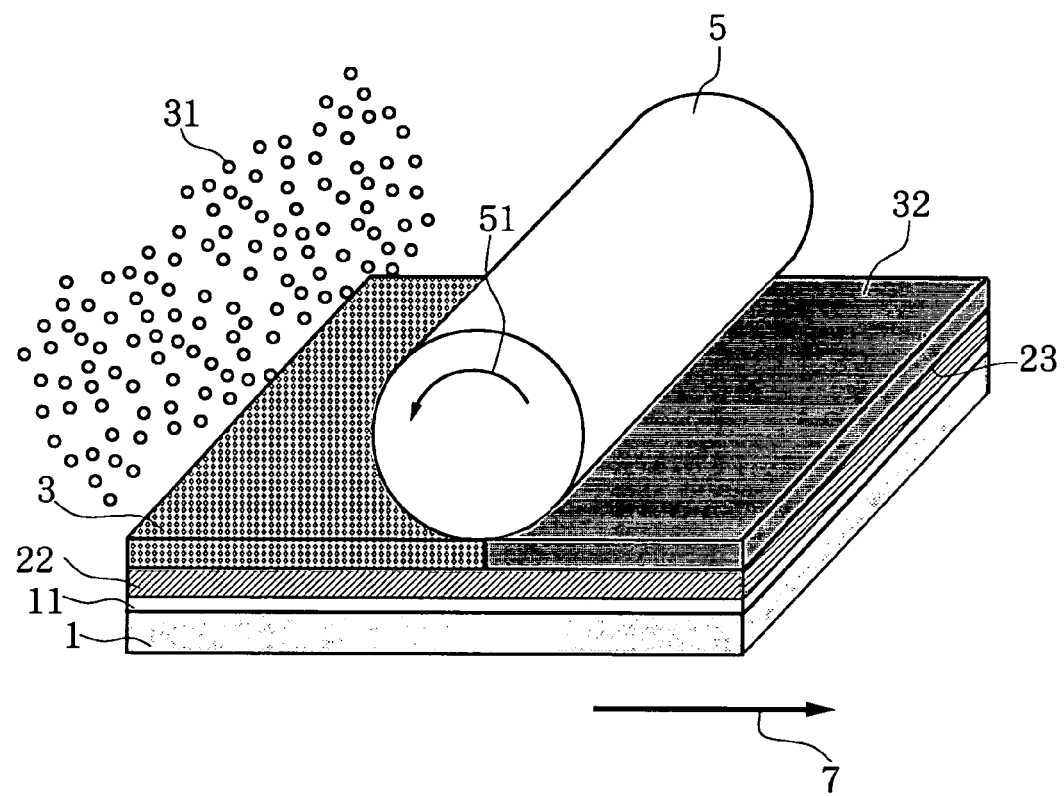
FIG. 3 is an exemplary view of a step for manufacturing a β-FeSi$_2$ thin film as a second layer and forming a junction surface of a β-FeSi$_2$ semiconductor thin film between a first and the second layers on a flexible substrate according to the present invention.

FIG. 2, and FIG. 3 show the embodiments according to fourth and fifth aspect of the present invention, in which thin films of the p-type and the n-type β-FeSi$_2$ semiconductors are made, respectively. FIG. 2 shows a method for manufacturing the p-type β-FeSi$_2$ thin film when an insulator is used for a base sheet material. An electroconductive thin-film layer 11 of gold, aluminum, of the like is deposited on a substrate 1 of a polyimide sheet beforehand and is used as an electrode when a device is formed.

When powders 21 of Fe and Si as a raw material are deposited on the metal-coated sheet, a powder of Al or Mn is added as a third element making a p-type character into the mixed raw material powders. In order to deposit the mixed powders 21 in uniform thickness on the sheet for forming a powder layer 2, the mixed powders 21 are coated by spraying or a doctor blade method after solving the mixed powders 21 with a solvent. That is, impurities are added to the powders of Fe and Si with an atomic ratio of about 1 to 2 as the raw materials for dissolution, solidification, and pulverization into fine powders. Subsequently, the fine powders are coated by the spraying method or a coating method by printing and dried for deposition in uniform thickness on the flexible sheet such as a polyimide sheet.

The powder layer 2 on the substrate 1 of the polyimide sheet is dried while moving in the direction of an arrow 7, and reaches a heating roller 4. The heating roller 4 is heated to 937° C. or less beforehand. The above temperature is required, and is not allowed to be exceeded for forming the semiconductor film 22 in a β-FeSi$_2$ phase. Though the semiconductor film 22 in the β-FeSi$_2$ phase is formed by heating processing at 500° C. to 900° C., the temperature is usually kept approximately at 900 ° C. to 920° C.

The heating roller 4 rotates in the direction of an arrow 51 to press the powder layer 2 on the substrate 1 of the polyimide sheet, and the semiconductor film 22 in a p-type β-FeSi$_2$ phase is generated by solid state reaction while the powders are heated and moved in contact with the heating roller 4. Thus, the flexible sheet on which the p-type β-FeSi$_2$ thin film is deposited is completed.

Embodiment According to Fifth Aspect of the Present Invention

FIG. 3 shows the embodiment according to a fifth aspect of the present invention, in which a p/n junction layer between the β-FeSi$_2$ semiconductor layers are made. When powders 31 of Fe and Si as a raw material for a β-FeSi$_2$ thin film are deposited on a flexible base sheet on which a p-type β-FeSi$_2$ semiconductor film 22 is formed a powder of Co or Ni is added into the mixed raw material powders as a third element making an n-type character. In order to deposit the mixed powders 31 in uniform thickness on the p-type β-FeSi$_2$ semiconductor film 22 for forming a coated layer 3, the mixed powders 31 are coated by spraying or the doctor blade method after solving the mixed powders 31 with a solvent.

The coated layer 3 on the substrate 1 of the sheet is dried while moving in the direction of an arrow 7, and is inserted under a heating roller 5. The heating roller 5 is heated to 937° C. or less beforehand. The above temperature is required, and is not allowed to be exceeded for forming the semiconductor film 32 in the β-FeSi$_2$ phase. The temperature is usually kept approximately at 900° C. to 920° C. The heating roller 5 rotates in the direction of an arrow 51 to press the coated layer 3 on the sheet, and the semiconductor film 32 in an n-type β-FeSi$_2$ phase is generated by solid state reaction while the powders are heated and moved in contact with the heating roller 5. At this time, an n-type junction surface is formed in contact with the p-type β-FeSi$_2$ semiconductor film 22. Thus, the flexible sheet comprising the junction surface between the p-type β-FeSi$_2$ thin film and the n-type β-FeSi$_2$ thin film is completed.

Embodiment According to Sixth Aspect of the Present Invention

Figure 4:
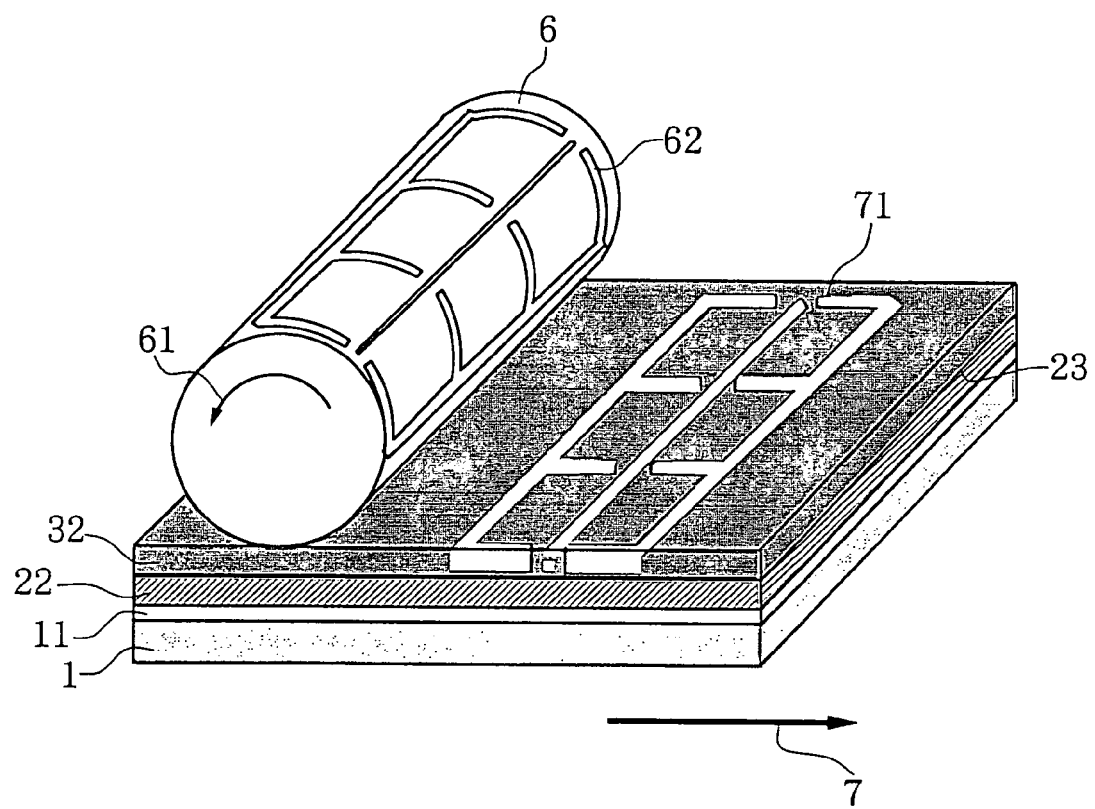
FIG. 4 is an exemplary view of a step for forming a device-electrode pattern on a β-FeSi$_2$ semiconductor thin film which has been manufactured on a flexible substrate according to the present invention.

FIG. 4 shows the embodiment according to a sixth aspect of the present invention, in which an electrode is formed on a β-FeSi$_2$ thin film. A substrate 1 of a flexible sheet on which two kinds of β-FeSi$_2$ semiconductor films 22, 32 forming a junction surface are deposited is pressed by a heating roller 6, which rotates in the direction of an arrow 61, for forming an electrode, and is moved in the direction of an arrow 7.

The heating roller 6 for forming an electrode is provided with protruding sculptures 62 which are sculpted in such a way that an electrode pattern is obtained later, and the protruding sculptures 62 is heated to 982° C. or more. The heating roller 6 for forming an electrode comprises a metal or ceramic roller and the like, and the usual temperature of the heating roller 6 for forming an electrode is 990° C. to 1100° C.

A surface part of the n-type β-FeSi$_2$ semiconductor film 32, which is in contact with the protruding sculptures 62 and is pressed by the sculptures 62 for superheating at 982° C. or more, is converted into the part in an α-Fe$_2$Si$_5$ phase which is of a metal phase with good electric conduction. Accordingly, the part becomes a device electrode 71 on the surface of the semiconductor. Steps in the method for forming an electrode can be reduced to cause an advantage of less failures, because steps in a vacuum, for example, for deposition of a pattern electrode and for lift-off can be eliminated.

Embodiment According to Seventh Aspect of the Present Invention

Figure 5:
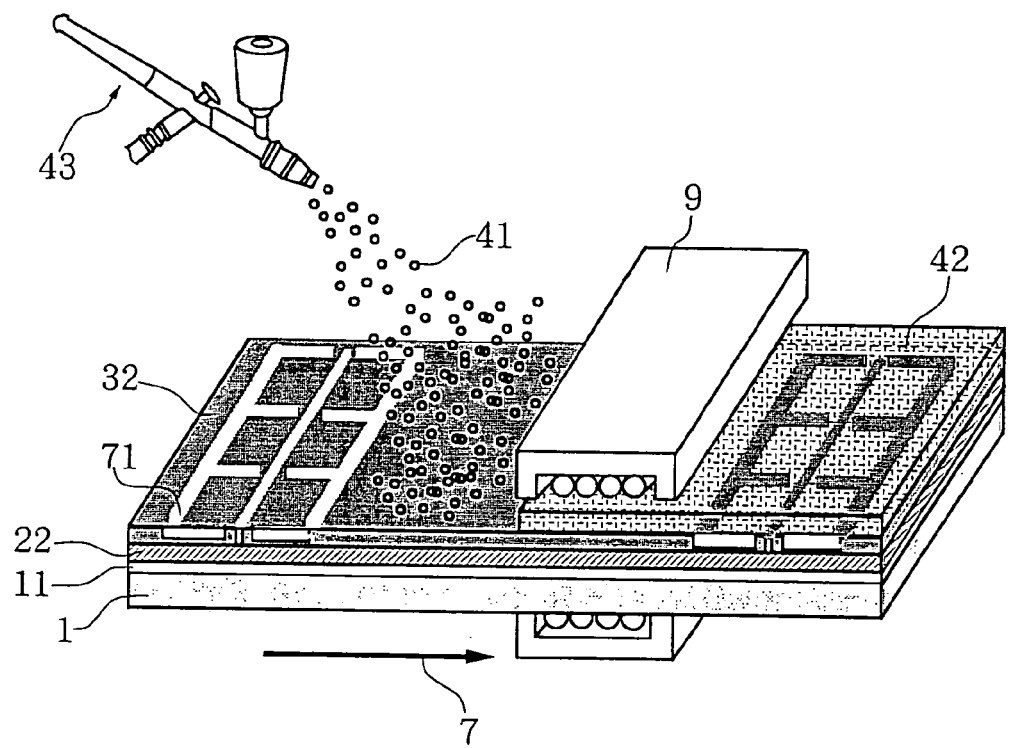
FIG. 5 is an exemplary view of a step for forming a light-antireflection protective film on a device which has been formed on a flexible substrate according to the present invention.

FIG. 5 shows the embodiment according to a seventh aspect of the present invention, in which a light-antireflection protective film is formed on a device which is formed on a flexible sheet. The light-antireflection protective film is made by putting a plurality of thin films of transparent dielectric substance, generally, with different refractive indexes from each other one on top the other. Ink obtained by diluting a hydroxide salt or an nitrate salt of an inorganic substance such as Si, Sn, Zn, Zr, or Ti with a solvent is supplied to a spray gun 43. A device sheet, on which a semiconductor film 32 with a junction between two kinds of β-FeSi$_2$ films is provided on the substrate 1 of the flexible sheet and an electrode 71 of a metallized electrode with an electrode pattern is formed on a part of the film 32, is moved in the direction of an arrow 7. Ink 41 supplied to a spray gun 43 is sprayed on the sheet with the gun 43 for deposition, and the sheet is dried. Subsequently, the sheet continuously passes through a baking furnace 9. A deposition layer is superheated to 200° C. to 400° C. during the passing, and an oxide film 42 is formed by reaction. Only repeating of the above processing is required for forming multiple layers of light-antireflection protective films. Here, a doctor blade method may be used for forming laminated powder layers. Moreover, a heating method using a lamp, or a pressing method using a heated roller may be used as a heating method.

Furthermore, ink obtained by diluting the above-described hydroxide salt or nitrate salt of an inorganic substance such as silicon, tin, zinc, and zirconia may be deposited in very thin thickness on the surface of the β-FeSi$_2$ semiconductor element formed on the flexible sheet which is continuously moving, using not only a spraying method, but also a coating method by printing. Subsequently, a plurality of thin films of transparent dielectric substance may be formed for a light-antireflection protective film not only by the baking furnace, but also, for example, by a method in which the sheet is moved under a flash lamp for heating, or in which the sheet is pressed by a heated roller at a high temperature.

Embodiment According to Eighth Aspect of the Present Invention

Figure 6:
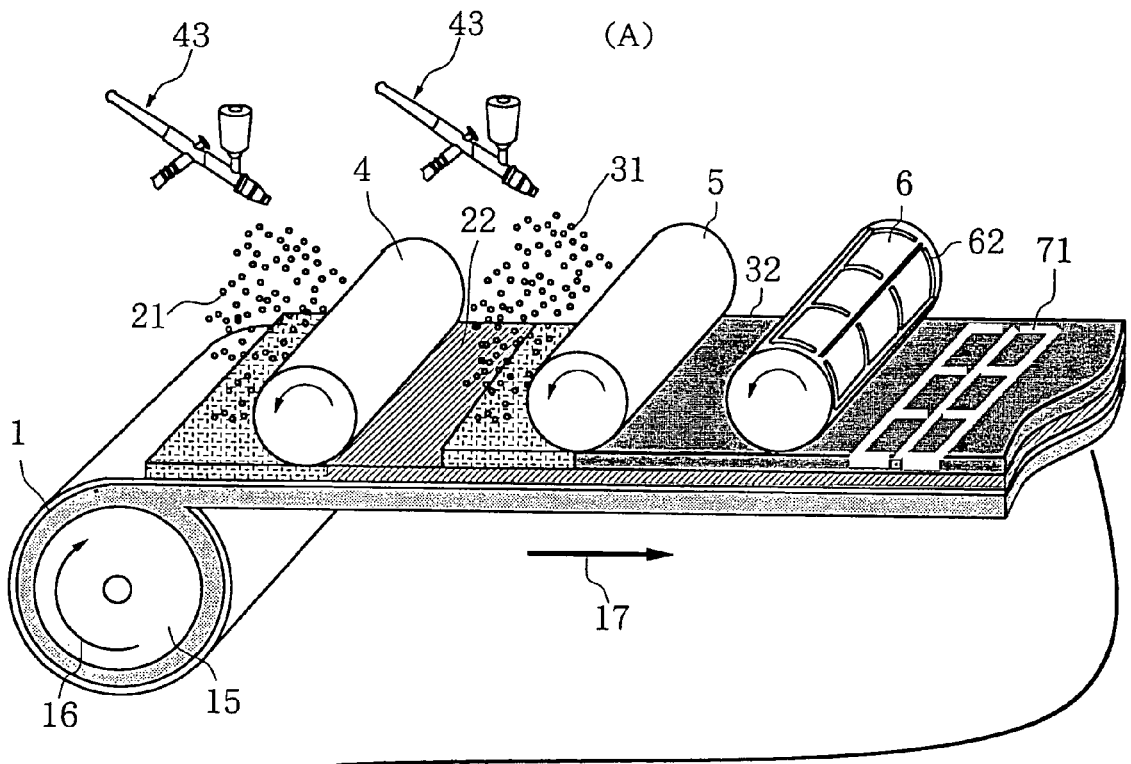
FIG. 6 is an exemplary view of steps for forming a device on a flexible substrate according to the present invention under a continuous manufacturing process-line, in which all processing steps in manufacturing a semiconductor film, forming a junction surface, forming an electrode and a light-antireflection protective film are integrated.
Figure 6:
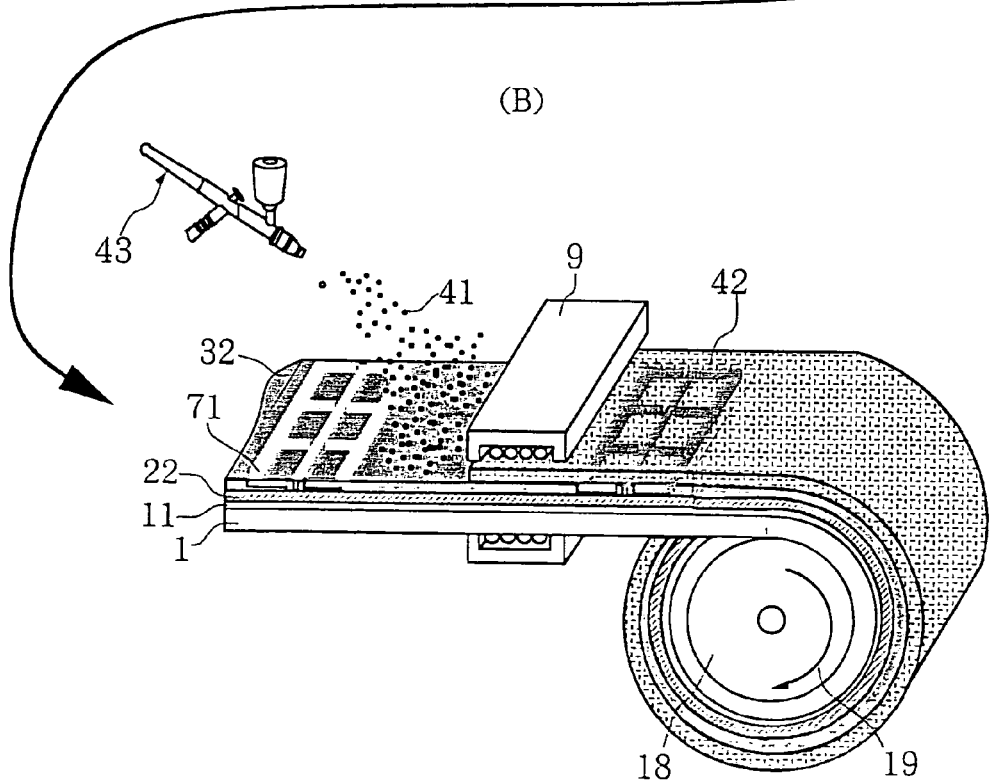

FIGS. 6(A) and 6 (B) show the embodiment according to an eighth aspect of the present invention, in which the β-FeSi$_2$ semiconductor device is continuously manufactured on a flexible sheet. A flexible-sheet material is wound around a sending roll 15, and a sheet film for a base 1 of a device is rotated and moved in the direction of an arrow 16 and is rotated and wound onto a takeup roll 18 in the direction of an arrow 19 after various kinds of manufacturing steps. In FIG. 6(A), a raw material powder 21 is deposited on the base 1 of the film delivered from the sending roll 15, and the β-FeSi$_2$ semiconductor film 22 as a first layer is formed by a heating roller 4 as a first step.

Then, a raw material powder with different magnetic polarity from that of the semiconductor film 22 is deposited and the β-FeSi$_2$ semiconductor film 32 as a second layer is formed by a heating roller 5 in order to form a semiconductor junction surface as a second step. Subsequently, the semiconductor film with a junction film is processed at the next third step. That is, the film is pressed by a heating roller 6 for forming an electrode. Thereafter, a part of the surface of the film is metallized to form an electrode 71 with an electrode pattern. Furthermore, the next step is shown in FIG. 6(B).

At a fourth step, ink 41 of a hydroxide raw material of dielectric substance is deposited by a spray unit; a light-antireflection protective film 42 is formed by reaction for the duration of time that the film is passing through a heating furnace forming a piece of heating means; and a main unit for functions of a device element is manufactured. Thus, the light-antireflection protective film 42 comprising a film of transparent dielectric substance is formed under placing a sol-gel thin layer and passing through the heating furnace 9 or the heated roller after the flexible sheet is moved. Moreover, these films are moved to the takeup roll 18, and are wound onto the roll 18 because the roll 18 is rotated in the direction of an arrow 19.

INDUSTRIAL APPLICABILITY

A single crystal silicon substrate or a polycrystalline silicon substrate has been used as a substrate for a previous device element using the β-FeSi$_2$ semiconductor. Or, sintered ceramics or glass has been adopted for the substrate, and amorphous silicon or a III-V compound semiconductor has been laminated on the substrate. On the other hand, a flexible metal plate of stainless steel, or a cheap polyimide sheet with thermal resistance is applied as a material for a substrate used in the sheet-type β-FeSi$_2$ element according to the present invention. These materials are very cheap in comparison with the price of the silicon substrate. Moreover, continuous processing can be realized, using a takeup roll because a material with much larger area or a longer one can be obtained. Moreover, there is no limit in the size, different from the case of a single crystal silicon substrate or an inorganic sintered one. Furthermore, when an element with a larger area comprising the above materials is processed for installation, the construction can be easily realized without any damages because the above materials are flexible.

When a metal thin plate is used as a substrate material, there is another characteristic, other than characteristics of the flexibility and the cheap price, that the thin plate itself is also used as an electrode for the base substrate. On the other hand, when an organic insulating material such as polyimide is directly used as a substrate material, a film on the surface of which gold foil, aluminum foil or the like is deposited beforehand, or a film in which an electrode is formed by changing a part of the β-FeSi$_2$ semiconductor film into a metal layer by heat processing is used on the substrate. By the deposition method, the film using the metal film can be obtained as a decoration film in a large quantity with a cheap price.

Furthermore, the processing for manufacturing according to the present invention is one of characters of the invention. The characteristic is that continuous production can be realized under an environment in an ordinary factory without using a vacuum system for all processing in manufacturing a film, forming an electrode and a protective film, and a continuous manufacturing process-line from raw materials to a completed element according to from fourth to eighth aspects. The reason is that a flexible material is used for a base substrate, and manufacturing processing steps can be also realized only by easy and much used technologies which have been used in ordinary factories. When a single crystal silicon substrate or a ceramic substrate is used in a similar manner to a previous method for manufacturing a semiconductor element, it is difficult to adopt a manufacturing method in which a film is moved. The invention has another characteristic that the throughput can be improved, and control cost of manufacturing devicees can be reduced because production processing by which a base film is sent from a roll and a completed product is wound onto another roll can be applied.

In the present invention, all the manufacturing steps are executed in an integrated manner for continuous production to cause remarkable reduction in the manufacturing cost of a product, because a film can be sent from a roll and wound onto another roll by using a flexible material for a substrate forming a device, and steps for manufacturing components forming the device can be realized by a continuous production method in the air.

What is claimed is:

1. A sheet-type $\beta$-FeSi$_2$ element forming a junction thin-film element comprising two kinds of $\beta$-FeSi$_2$ semiconductor thin-films with p-type and n-type characteristics on a flexible sheet, wherein
    a part of the junction thin-film element is changed into an $\alpha$-Fe$_2$Si$_5$ metal film for an electrode, and, furthermore,
    a film of dielectric substance is provided as a surface protective layer on the surface of the junction thin film element for device functions.

2. The sheet-type $\beta$-FeSi$_2$ element according to claim 1, wherein
    a metal thin-plate, in which iron, nickel, and copper are independently used, or alloys comprising them or alloys comprising them as principal ingredients and one or more kinds of additional elements are included, is adopted as the flexible sheet.

3. The sheet-type $\beta$-FeSi$_2$ element according to claim 1, wherein
    a resin film using polyimide or fluoropolymers is used as the flexible sheet.

4. A method for manufacturing a sheet-type $\beta$-FeSi$_2$ element, wherein
    fine powders are coated by a spraying method or a coating method by printing and dried for deposition in uniform thickness on a flexible sheet after impurities are added to powders of Fe and Si with an atomic ratio of about 1 to 2 as raw materials for dissolution, solidification, and pulverization into the fine powders,
    heating processing at 500° C. to 900° C. is executed to form a first $\beta$-FeSi$_2$ semiconductor thin-film,
    fine powders are deposited in uniform thickness on the first $\beta$-FeSi$_2$ semiconductor thin-film above the flexible sheet by the spraying method or the coating method by printing after impurities with the opposite characteristic to that of the first $\beta$-FeSi$_2$ semiconductor thin-film are added to powders of Fe and Si with an atomic ratio of about 1 to 2 as raw materials for dissolution, solidification, and pulverization into the fine powders,
    heating processing at 500° C. to 900° C. is executed to form a second $\beta$-FeSi$_2$ semiconductor thin-film, and finally two kinds of the $\beta$-FeSi$_2$ semiconductor thin-films forming a p-n junction interface between them are formed.

5. The method for manufacturing a sheet-type $\beta$-FeSi$_2$ element according to claim 4, wherein
    a powder layer deposited on the flexible sheet is pressed by a heating roller superheated at 500° C. to 900° C. in a non-oxidation atmosphere, and
    two kinds of the $\beta$-FeSi$_2$ semiconductor thin-films forming a p-n junction interface between them are manufactured by continuous heat processing as a technique by which reaction of mixed powders comprising an Fe ingredient and a Si ingredient, which are deposited on the flexible sheet, is executed to form the mixed powders in a $\beta$-FeSi$_2$ phase.

6. The method for manufacturing a sheet-type $\beta$-FeSi$_2$ element according to claim 4, wherein
    a part which is in contact with a heating roller for forming an electrode when the heating roller for forming an electrode is pressed on the flexible sheet with the $\beta$-FeSi$_2$ semiconductor films, which is continuously moving, is made into an electrode, after the heating roller for forming an electrode provided with sculptures which are sculpted in such a way that an electrode pattern is obtained later is heated.

7. The method for manufacturing a sheet-type $\beta$-FeSi$_2$ element according to claim 4, wherein
    ink obtained by diluting hydroxide salt or nitrate salt of an inorganic substance such as silicon, tin, zinc, and zirconia is deposited in very thin thickness on the surface of the $\beta$-FeSi$_2$ semiconductor element formed on the flexible sheet which is continuously moving, using the spraying method, or the coating method by printing, and, then,
    a thin film of transparent dielectric substance is formed for a light-antireflection protective film by a baking furnace, or by a method in which the flexible sheet is moved under a flash lamp for heating, or in which the sheet is pressed by a heated roller at a high temperature.

8. A method for manufacturing a sheet-type $\beta$-FeSi$_2$ element, comprising:
    a step at which powders with p-type or n-type characteristics are deposited on a sent flexible sheet;
    a step at which, after the flexible sheet is moved from a point for the step, $\beta$-FeSi$_2$ semiconductor thin-films are continuously formed by pressing a heating roller onto a powder layer on which the powders are deposited;
    a step at which, after the flexible sheet is further moved from points for the steps, a part of the $\beta$-FeSi$_2$ semiconductor thin-film is changed into a film in a $\alpha$-Fe$_2$Si$_5$ metal phase for an electrode by a heating roller for sculpting an electrode pattern; and
    a step at which, after the flexible sheet is still further moved from points for the steps, a film of transparent dielectric substance is formed by placing a sol-gel thin layer and passing it through a piece of heating means, wherein
    all of the steps are executed in an integrated manner for continuous manufacturing of a device.

* * * * *